United States Patent
Chung-Maloney et al.

(10) Patent No.: US 7,266,789 B2
(45) Date of Patent: Sep. 4, 2007

(54) METHOD AND APPARATUS OF OPTIMIZING THE IO COLLAR OF A PERIPHERAL IMAGE

(75) Inventors: Wai Ling Chung-Maloney, Waterbury Center, VT (US); Haruo Ito, Shiga (JP); Douglas W. Stout, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 190 days.

(21) Appl. No.: 10/907,499

(22) Filed: Apr. 4, 2005

(65) Prior Publication Data

US 2006/0225006 A1    Oct. 5, 2006

(51) Int. Cl.
*G06F 17/50*    (2006.01)
(52) U.S. Cl. .................... 716/2; 716/1; 716/11; 716/12
(58) Field of Classification Search .................... 716/2, 716/10, 8, 11, 1, 12
See application file for complete search history.

(56) References Cited

U.S. PATENT DOCUMENTS

| 6,163,042 | A | 12/2000 | Mizushima et al. |
| 6,457,157 | B1 | 9/2002 | Singh et al. |
| 6,721,933 | B2 | 4/2004 | Iwasa |
| 7,194,707 | B2 * | 3/2007 | Chung-Maloney et al. .... 716/4 |
| 2003/0137861 | A1 | 7/2003 | Thies et al. |

FOREIGN PATENT DOCUMENTS

| JP | 8-96022 | 4/1996 |
| JP | 9-321142 | 12/1997 |
| JP | 2000-100955 | 4/2000 |

OTHER PUBLICATIONS

English Language Abstract of JP 2000-100955.
English Language Abstract of JP 9-321142.
English Language Abstract of JP 8-96022.

* cited by examiner

*Primary Examiner*—Thuan V. Do
*Assistant Examiner*—Magid Y. Dimyan
(74) *Attorney, Agent, or Firm*—Richard M. Kotulak; Greenblum & Bernstein, P.L.C.

(57) ABSTRACT

An apparatus and method for optimizing the size of an IO collar and reducing the die size of an IC chip is provided. The method and apparatus includes arranging rotated IO cells around the edges of the IC chip to reduce the number of unused IO cells in the IO collar. All the IO cells may be rotated, or a combination of rotated and non-rotated IO cells may form the IO collar. For each edge of the IC chip having rotated IO cells, each edge may have the same number of stacks of IO cells or a different number of stacks of IO cells.

20 Claims, 9 Drawing Sheets

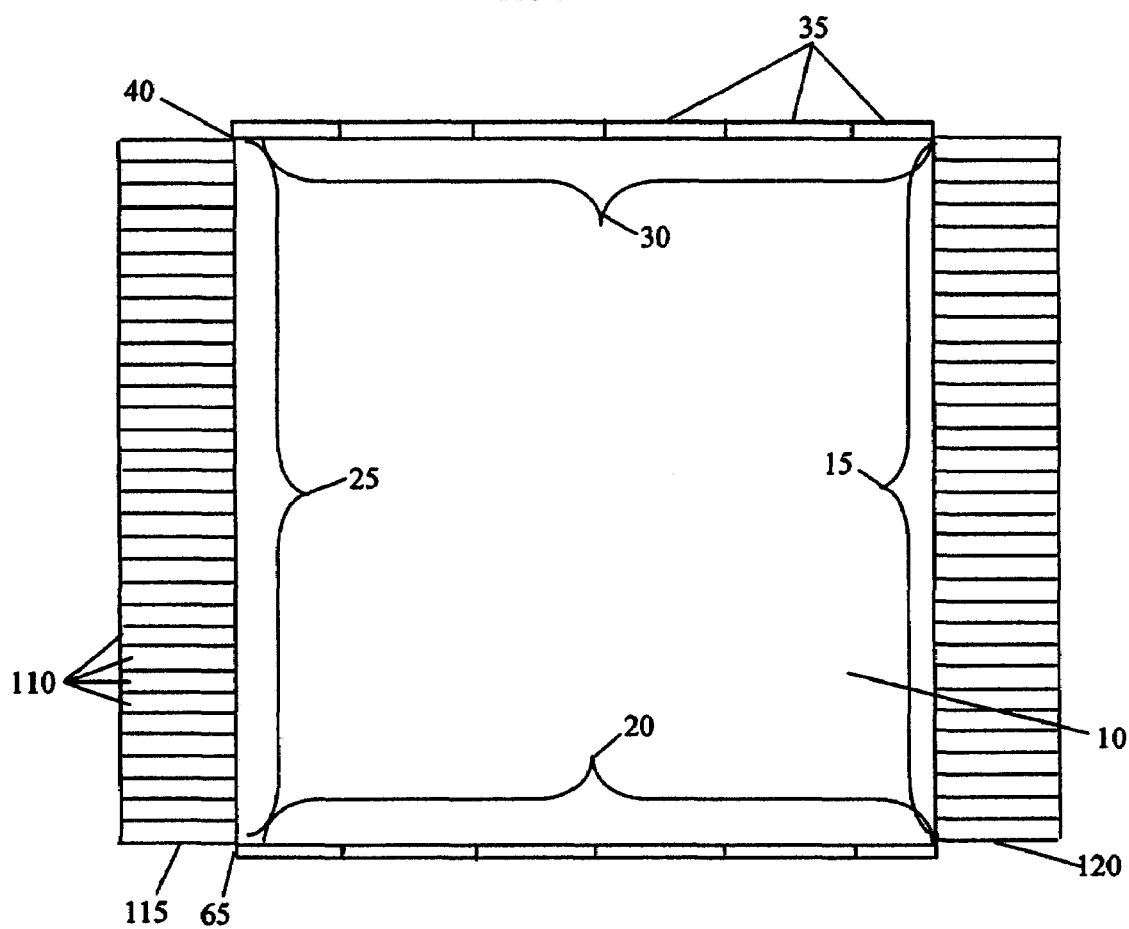

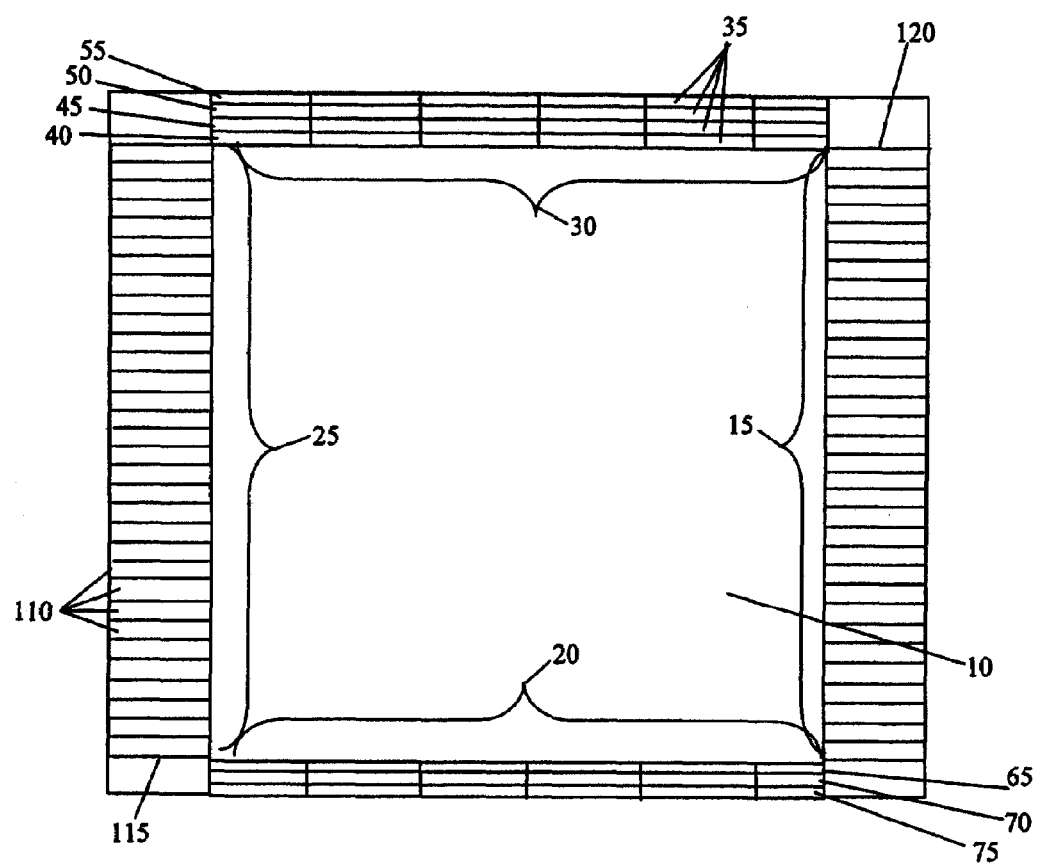

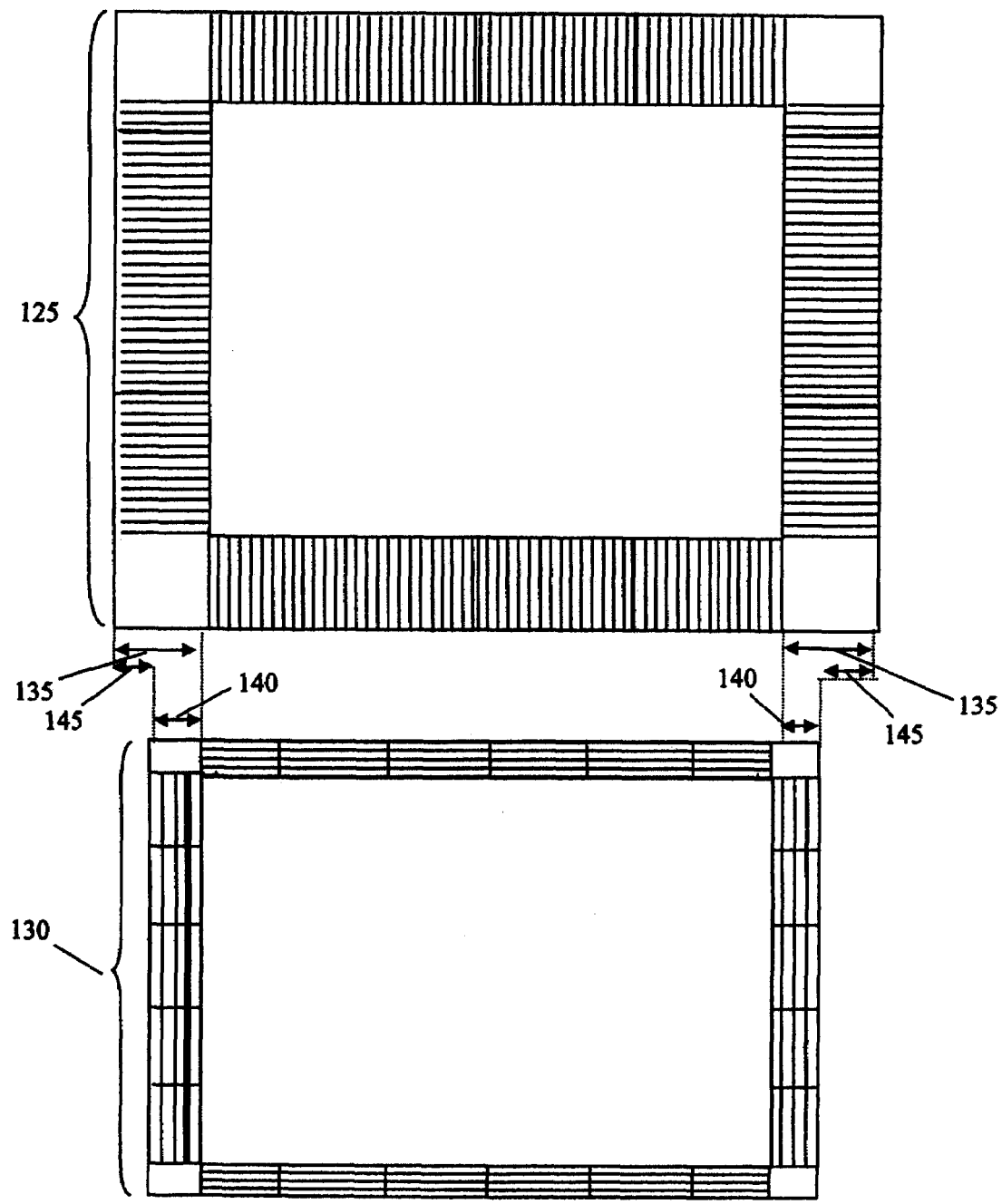

METHOD AND APPARATUS OF OPTIMIZING THE IO COLLAR OF A PERIPHERAL IMAGE

FIELD OF THE INVENTION

The invention relates to circuit layout and design methods, and more particularly to the layout of IO cells on an integrated circuit chip.

BACKGROUND DESCRIPTION

Many ASIC wirebond chips are not IO-limited, meaning the image/package can support more IOs than the design requires. In some designs the internal logic of the design of the IC chip dictates the size and thus more IO cells than are needed are formed in the IO collar surrounding the IC chip. Since IO cells can only occupy the IO sites, the unused IO sites are wasted space. IO cells tend to be very large compared to the other logic and, depending on the number of unused IO sites, this wasted space can be a noticeable proportion of the die. Since the cost to manufacture a die is directly proportional to the area of the die, it is desirable to make the die as small as possible.

An IO cell tends to be rectangular in shape, and typically in a peripheral IO chip the long side of the IO cells are placed perpendicular to the chip edge and the short side of the IOs are placed parallel to the chip edge. Additionally IO cells are placed all along each edge of the chip to form an IO cell collar, thus a chip will be completely surrounded by IO cells where each IO cell is arranged so that its long axis is perpendicular to the edge of the chip. Accordingly, a footprint of a chip is extended by 2× the length of the IO cells. However, it should be noted that typically the chip only utilizes a fraction of the available IO cells. Thus, a chip will be surrounded by active IO cells, and inactive IO cells. The inactive IO cells consequently take up chip real estate without serving a purpose. But, simply removing the inactive IO cells does not reduce the width or height of the combination of chip and IO cells since there are other IO cells along each side of the chip which are required and thus extend the dimension of the chip along that edge.

The dimensions of a single IO cell in a peripheral IO chip is typically determined by technology limitations and the functionality of the IO cell. When an IO cell is traditionally arranged perpendicular to a chip edge, the short edge of the IO cell dimension is often determined by a combination of the minimum bond pad pitch and the purpose of the IO cell. Next, the long dimension of the IO cell is determined again by the functionality of the IO cell, such as, for example, how much circuitry must fit into the IO cell. Accordingly, the length and width of the IO cell is determined by its functionality, and thus an IO cell has a minimum size beyond which it cannot be reduced. Accordingly, traditional methods of IO cell layout do not consider the design requirements of the IC chip to optimize space, and thus, traditional IO cell layout methods waste space by requiring unnecessarily large IC chip and IO collar designs.

Other conventional methods to configure the IO cells in an IO collar include, rotated IOs, and pad over ESD and pad over active devices. Also included is routing power from power pad to the power bussing w/o the use of an IO power book.

SUMMARY OF THE INVENTION

In a first aspect of the invention, a method of reducing the die size of an IC chip includes the steps of determining a minimum number of IO cells required by the IC chip, and arranging the minimum number of IO cells in rows of IO cells around edges of the circuit where at least one of the rows of IO cells comprises rotated IO cells. The method also includes completing any incomplete row of IO cells by adding unused IO cells to the incomplete row of IO cells.

In embodiments of the invention, the method further includes determining a smallest size and an aspect ratio of a core of an IC chip and determining, with no order implied:
i) a number of rotated IO cells which can fit in a single row around a first and second horizontal edge of the IC chip;
ii) a number of rotated IO cells which can fit in a single row around a first and second vertical edge of the circuit;
iii) a total number of IO cells required by the IC chip by determining a total number of signal IO cells and a total number of unused IO cells;
iv) an actual number of rotated IO cells by multiplying
   a) the number of rotated IO cells of the first horizontal edge by a first integer,
   b) the number of rotated IO cells of the second horizontal edge by a second integer,
   c) the number of rotated IO cells of the vertical edge by a third integer, and
   d) the number of rotated IO cells of the second vertical edge by a fourth integer, where the first, second, third and fourth integers are selected such that the total number of rotated IO cells is greater than or equal to the total number of IO cells required by the IC chip.

The method further includes comparing an x dimension and a y dimension of an IO collar formed by an actual number of rotated IO cells to an IO collar formed by non-rotated IO cells. The method further includes determining the x dimension of a reduced die size by adding 2 times the y dimension collar height to the x dimension of the core size, and determining the y dimension of a reduced die size by adding 2 times the x dimension collar height to the y dimension of the core of the IC chip.

In another aspect of the invention, the method includes determining a number of non-rotated signal IO cells in a single row which can fit along a first and second vertical edge of an IC chip. The method further includes determining a number of rotated signal IO cells in a single row which can fit along a first and second horizontal edge of the IC chip, and determining the total number of IO cells needed by the IC chip by adding the total number of signal IO cells to the number of unused IO cells. Additionally, the method includes determining the total number of non-rotated IO cells by determining the total number of non-rotated signal IO cells and non-rotated unused IO cells which can fit along the first and second vertical edges of the IC chip. The method of the invention also determines the balance of signal IO cells and unused IO cells by subtracting the total number of non-rotated IO cells from the total number of IO cells. Additionally, the method makes a determination of the rotated IO cell stack height for the first and second horizontal edges by (with no order implied):
i) multiplying the number of rotated IO cells of the first horizontal edge by a first integer, and
ii) multiplying the number of rotated IO cells of the second horizontal edge by a second integer, where the first and second integers are selected such that the total number of rotated IO cells is greater than or equal to the balance of signal IO cells and unused IO cells.

In another aspect of the invention, a method of arranging IO cells in an IO collar includes the steps of determining the smallest core size and its aspect ratio, and determining a minimum number of functioning IO cells needed by an IC chip. The method also includes determining a total number of IO cells to fit along each edge of the IC chip, and determine an IO cell stack height for each edge of the IC chip based on the minimum number of functioning IO cells needed by an IC chip and the total number of IO cells to fit along an edge of the IC chip. Additionally, the method includes arranging IO cells in rows along each edge of the IC chip, and completing any incomplete rows of IO cells by adding unused IO cells to the incomplete rows of IO cells.

In another aspect of the invention, an IO collar includes a first row of IO cells distributed along a first edge of an IC chip, wherein the first row of IO cells comprises non-rotated IO cells, and a second row of IO cells distributed along at least a second edge of an IC chip, wherein the second row comprises rotated IO cells. The IO collar also includes a third row of IO cells distributed along a third edge of the IC chip, and a fourth row of IO cells distributed along a fourth edge of the IC chip.

BRIEF DESCRIPTION OF THE DRAWINGS

FIGS. 7 and 8 shows an IO collar having IO cells arranged in accordance with a third embodiment of the invention; and FIG. 9 shows the reduction in size of an IC chip and corresponding IO collar having IO cells arranged in accordance with an embodiment of the invention.

DETAILED DESCRIPTION OF EMBODIMENTS OF THE INVENTION

Figure 1:
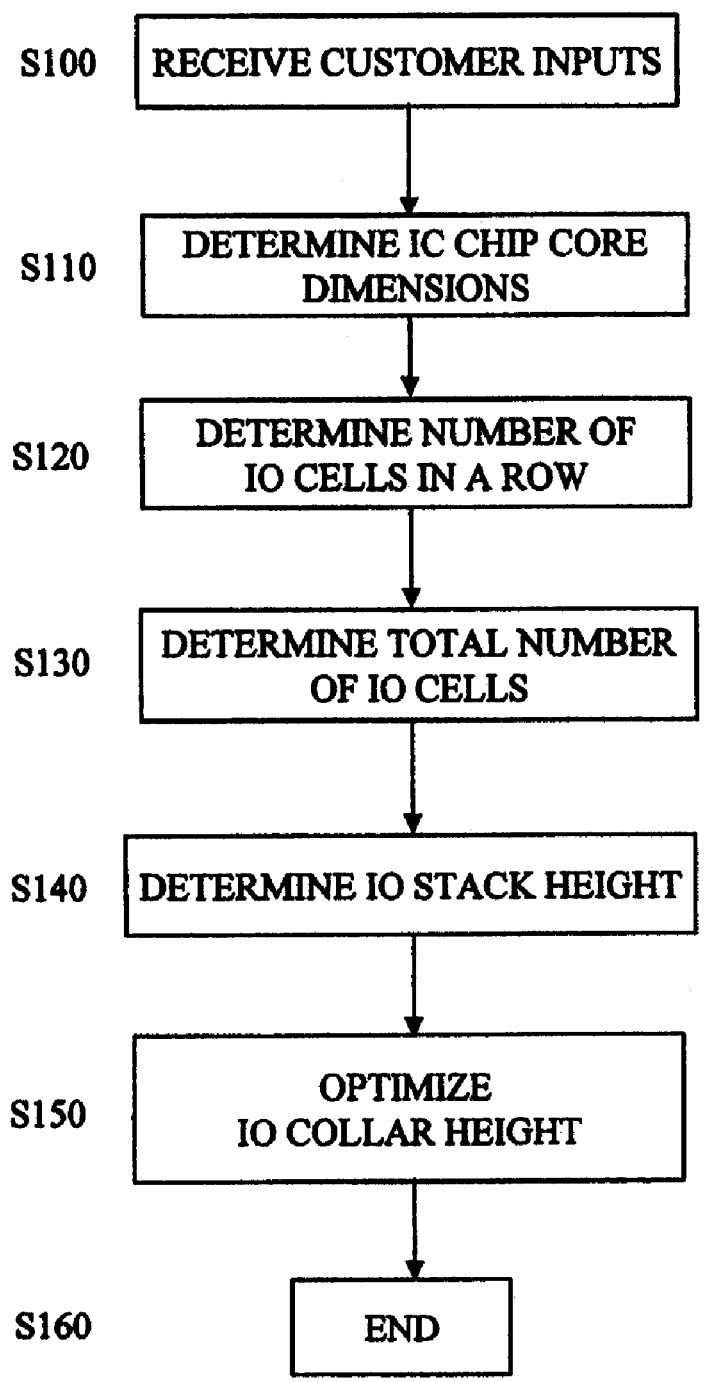
FIG. 1 shows steps of a first embodiment of the invention for configuring IO cells in an IO collar.

Embodiments of the invention use an alternate IO cell placement method to optimize and/or eliminate unused IO cell areas of a non IO-limited design without the overhead of additional IO development. Thus, embodiments of the invention include a method to optimize the size of an IO collar by reducing the number of unused IO sites and rearranging the remaining IO cells in the IO collar. By performing such a rearrangement, the die size can be kept as small as possible.

Embodiments of the invention include a method and apparatus for rotating and stacking IO cells on the IC chip image to optimize the IO collar height or thickness by eliminating or the reducing number of unused IO sites. As used herein, "rotating" an IO cell means to orient the long axis of the IO cell parallel to the edge of the IC chip. One of many advantages of the embodiments of the invention is the ability to use the same IO form factor for an IO limited and a non IO limited IC chip design. This may be accomplished by using the rotated placement and appropriate number of stacked IOs to optimize the IO collar and reduce wasted space to arrive at a smaller die. The embodiments described herein may also be used to better optimize IC chip images based on floorplan, wiring resource or technology constraints (e.g. polysilicon gate orientation).

In one embodiment, a uniform IO collar height around the periphery of the IC chip can be achieved. In another embodiment, although uniform IO collar height around the chip periphery may not be achieved, the IC chip will be smaller for certain IC chip designs. In another embodiment, an IO collar containing both rotated and non-rotated IOs can be achieved, which allows a common family of IO cells to be used in semiconductor technologies that require a common transistor gate orientation due to lithographic restrictions. This is possible because all the IO cells can have the same orientation regardless of where in the IO collar it is located. Finally, utilizing any of the embodiments may result in a core area and/or final chip size that does not have the same x and y-dimensions.

Each of the embodiments requires certain inputs that are typically provided by the designer or IC chip customer. These inputs are referred to herein as required customer inputs. One of the required customer inputs is the total cell count required called "CELLS_required." The CELLS_required will typically include area utilization, wireability, floorplanning constraints, etc. Another of the required customer inputs includes floor plan constraints such as IP core content, available horizontal vs. vertical chip wiring resources, and proximity requirements of core logic to associated IO. These inputs should be specified because they will affect the choice in aspect ratio (core x-dimension/core y-dimension) of the CELLS_required parameter.

Total signal IO (SIO) count required called "SIO_required" is another customer input. This is the number of active IO cells for signal input and/or output required by the circuit design. An additional required customer input is total number of wirebond pads required, including but not limited to SIOs, power pads (GND, VDD and VDDX), and programmable power pads. Also required as a customer input is the total number of IO cells without a pad required, such as for example, DECAPs, IOESDs, etc.

Referring to FIG. 1, steps of a first embodiment of a method for optimizing an IO collar is shown where the first step includes receiving the customer inputs S100. Next, an IC chip core dimensions are determined, which may include determining the aspect ratio of the IC core cell area (S110). As used herein, "IC core cell" is synonymous with "IC core." Typically, determining the aspect ratio includes finding the smallest core size and aspect ratio to meet total number of core cells (CELLS)>=CELLS_required. For example, the aspect ratio may not equal one in order to optimize for the constraints described in "Required customer inputs" above.

Next, the number of IO cells per row is determined (S120). Specifically, the number of rotated IOs in a single row that can fit around the IC chip is determined. After the number of rotated IO cells in a single row around the chip is found, the total number of needed IO cells is found (S130). This is done by taking the total SIO count plus the number of unused IO cells needed to determine the total number of IO cells needed for the design. IO cell stack height is then determined (S140). The IO stack is determined such that the answer derived in step at S130 is less than or equal to the value of step S120 times an integer (i.e., 1, 2, 3 . . . ), where the integer is the number of IO cells in the stack, and thus cannot be a fractional number.

The IO collar height is then optimized (S150). Optimization is performed by a comparison between collar height of a rotated IO stack to a non-rotated IO collar height, and the IO collar height is adjusted accordingly. In particular, if the rotated collar height is smaller than the non-rotated height, 2x collar height is added to core size to determine the "reduced die size." If the non-rotated IO collar height is equal or larger, then there is no benefit to rotating the IO cells and creating the rotated IO cell stacks along the edges of the IC chip. The process then ends (S160).

Figure 2:
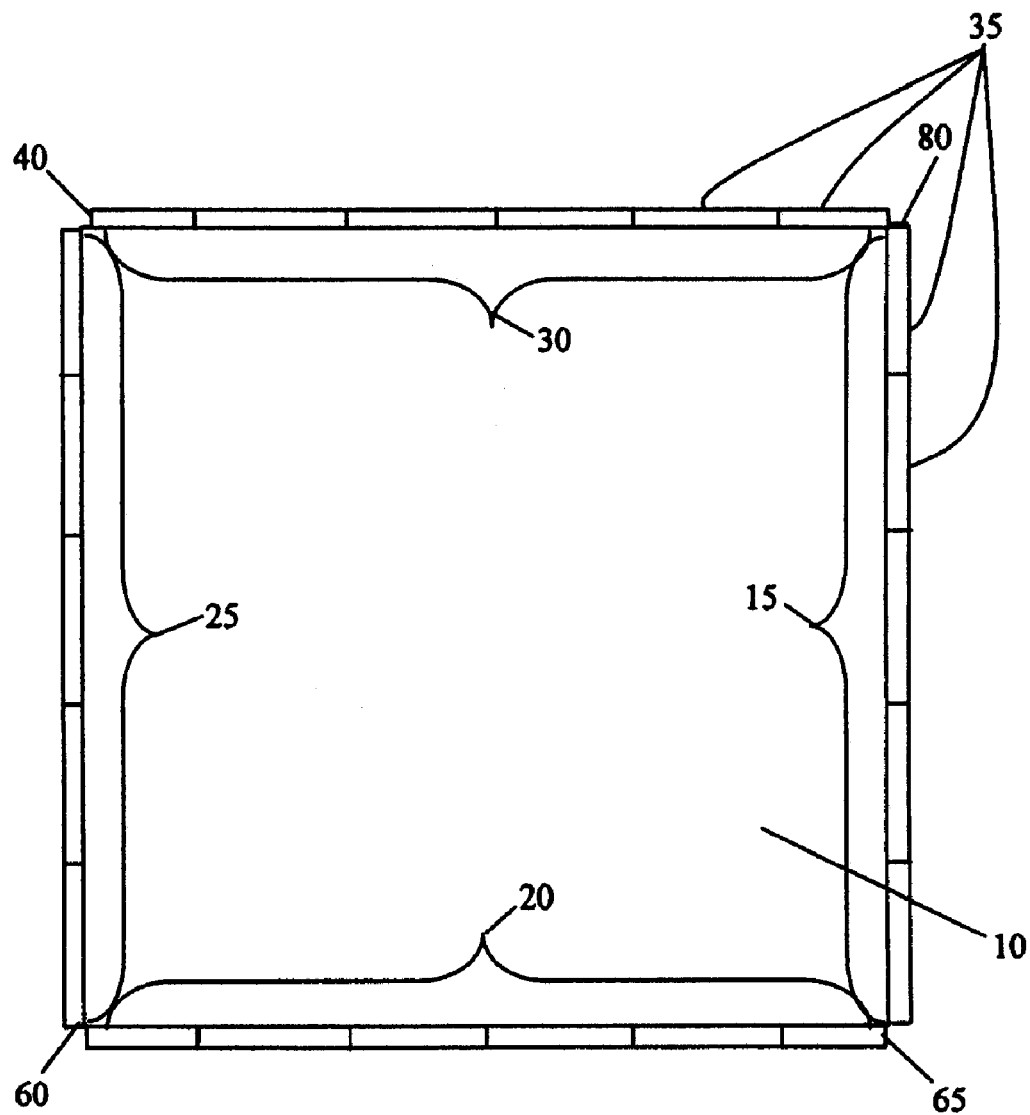
FIGS. 2 and 3 show the arrangement of an IO collar in accordance with a first embodiment of the invention.

Referring to FIG. 2, an example of an IC chip 10 is shown surrounded by a single row of rotated IO cells 35 resulting from steps S110 and S120 of the method of the first embodiment. Specifically, a first edge 15 has IO cells 35 arranged in a row 80 of single height stack. The second edge 20 has a row 65 of IO cells 35 arranged in single stack height. The third edge 25 has a row of IO cells 35 arranged in a single height stack 60. The fourth edge 30 of the IC chip 10 has a row 40 of IO cells 35 arranged in a single stack. Accordingly, all of the IO cells 35 are arranged in rows 65, 60, 40 and 80 in a single height stack after steps S110 and S120 of FIG. 1.

Figure 3:
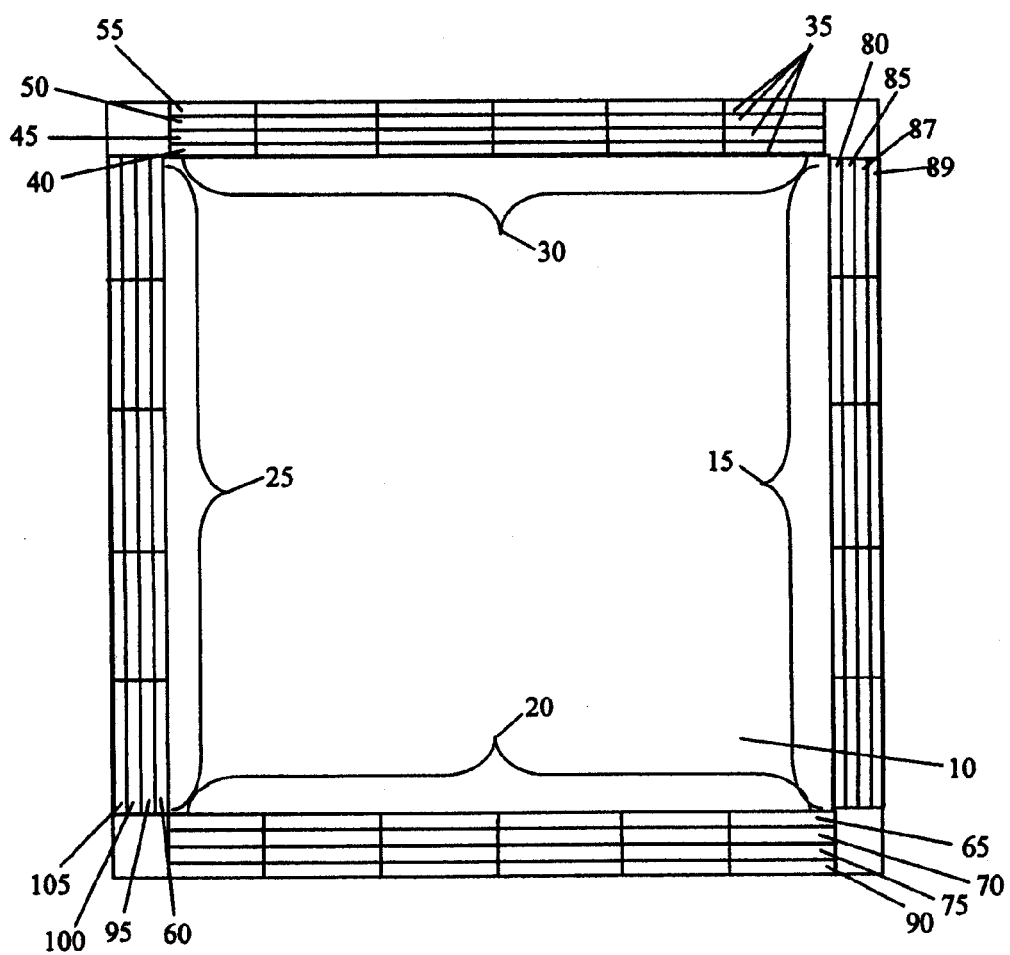

Referring to FIG. 3, an example of an IC chip 10 which has had additional rows of IO cells 35 added from steps S130 and S140 of the method of the first embodiment is shown. Accordingly, the edge 15 of the IC chip 10 has four rows 80, 85, 87, 89 formed thereon. In a similar manner, the edge 20, the edge 25, and the edge 30 have four rows of IO cells 35 formed thereon. Specifically, the edge 20 has rows 65, 70, 75, and 90; the edge 25 has rows 60, 95, 100, and 105; and, the edge 30 has rows 40, 45, 50, and 55.

Accordingly, the method of the first embodiment arranges IC cells in rotated positions around the edges of an IC chip and specifies an equal number of rows of IO cells around each edge of the IC chip. As such, there may still be some unused IO cells in the IO collar. However, the number of IO cells is reduced below the number of unused IO cells if all of the IO cell were non-rotated.

Figure 4:
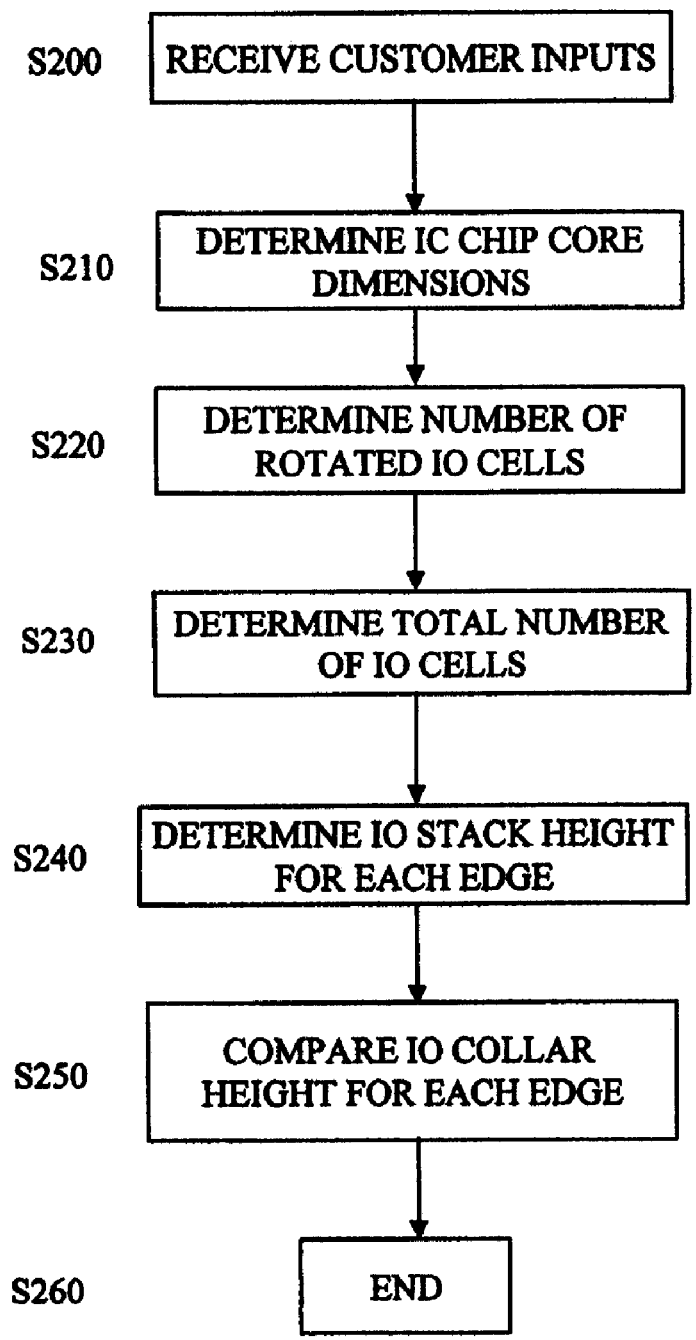
FIG. 4 show steps of a second embodiment of the invention for configuring IO cells in an IO collar.

Referring to FIG. 4, another embodiment of a method to arrange IO cells in an IO collar is shown. The method starts with receiving required customer inputs as described above (S200). Next, an IC chip core dimensions are determined, which may include determining the aspect ratio of the core cell area (S210). To find the aspect ratio, the smallest core size and corresponding aspect ratio to meet CELLS>=CELLS_required is found. The aspect ratio may not equal one in order to optimize for the constraints described in "Required customer inputs" above.

The number of rotated and non-rotated IO cells for each edge is then found (S220). Specifically, the number of rotated IOs in a single row that can fit on the horizontal edge of the chip is found, and the number of rotated IOs in a single row that can fit on the vertical edge of the IC chip is found. Thus, the total number of IO cells which may fit in a single row around the IC chip is determined. The total number of needed IO cells is determined (S230). This number is found by taking the total SIO cell count plus number of unused IO cells needed to determine the total number of IO cells needed for the design.

Next, the stack height for each edge is found (S240). Specifically, the IO cell stack for the horizontal edge and the vertical edge of the IC chip such that the sum of the IO cells for each edge is greater or equal to the answer derived in step 230 is determined as follows:

1. the result of step S220 for horizontal edge #1 times an integer (1, 2, 3, . . . ), is found;
2. the result of step S220 for horizontal edge #2 times an integer (1, 2, 3, . . . ) is found;
3. the result of step S220 for vertical edge #1 times an integer (1, 2, 3, . . . ) is found; and
4. the result of step S220 for vertical edge #2 times an integer (1, 2, 3, . . . ) is found, where the integer is the number of IO cells in the stack, and thus cannot be a fractional number.

Next, the IO collar height is optimized (S250). Optimization is done by comparing the x dimension and the dimensions of the IO collar height of a rotated IO stack to a non-rotated IO collar height. If the height of the rotated IO stack is smaller than the non-rotated height, then the x dimension of the "reduced die size" is determined by adding 2 times the y dimension collar height to the x dimension of core size. Then the y dimension of the "reduced die size" is determined by adding 2 times the x dimension collar height to the y of core size.

If the height of the rotated IO stack is equal or larger than the non-rotated height, then there is no benefit to rotating the IO and creating the IO stack and the IO collar will consist of non-rotated IO cells. The process then ends (S260).

The first two steps, S210 and S220, results in an IO cell configuration similar to that described in FIG. 2. The results of steps S230 and S240 result in an IO collar configuration shown in FIG. 5, for example. Accordingly, an IC chip 10 will be surrounded by rotated IO cells 35, where each edge of the IC chip 10 may have a different number of rows on its edge.

Figure 5:
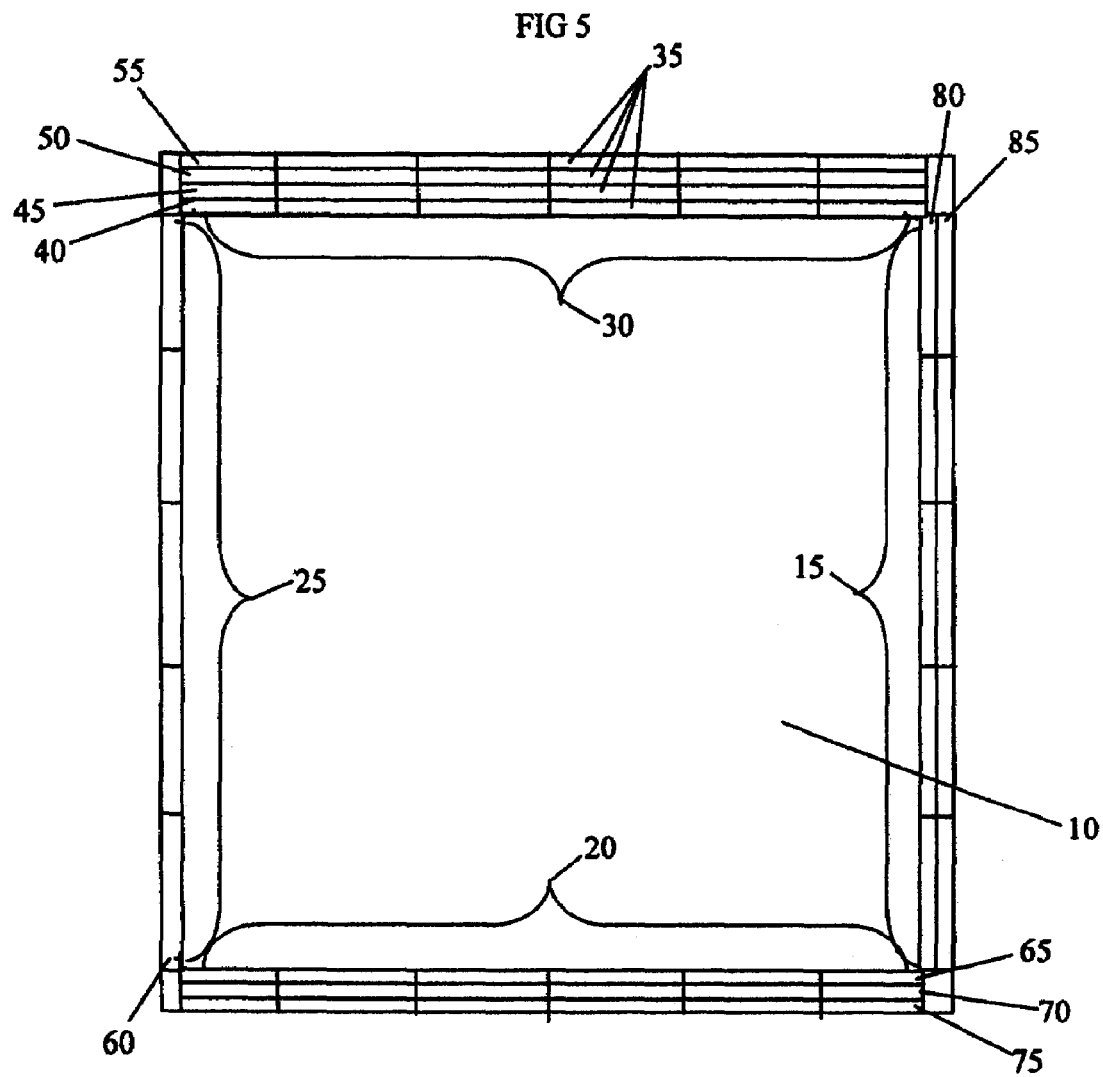
FIG. 5 shows IO cells of an IO collar arranged in accordance with a second embodiment of the invention.

More specifically, the example shown in FIG. 5 shows the first edge 15 of the IC chip 10 having a first row 80 and a second row 85 of IO cells 35. The edge 20 includes three rows of IO cells: a first row 65, a second row 70, and a third row 75 of IO cells 35. The edge 25 includes a single row 60 of IO cells 35. Finally, the edge 30 of the IC chip 10 includes a first row 40, a second row 45, a third row 50, and a fourth row 55 of IO cells 35 arranged on its edge.

Because the method of the second embodiment allows each edge to have a different number of rows of IO cells, the second method may allow a higher level of optimization of IO cells thus allowing for a smaller die as compared to the first embodiment. Accordingly, the second embodiment typically allows for a IC chip die size which may be smaller than the IC chip die size of the first method.

Figure 6:
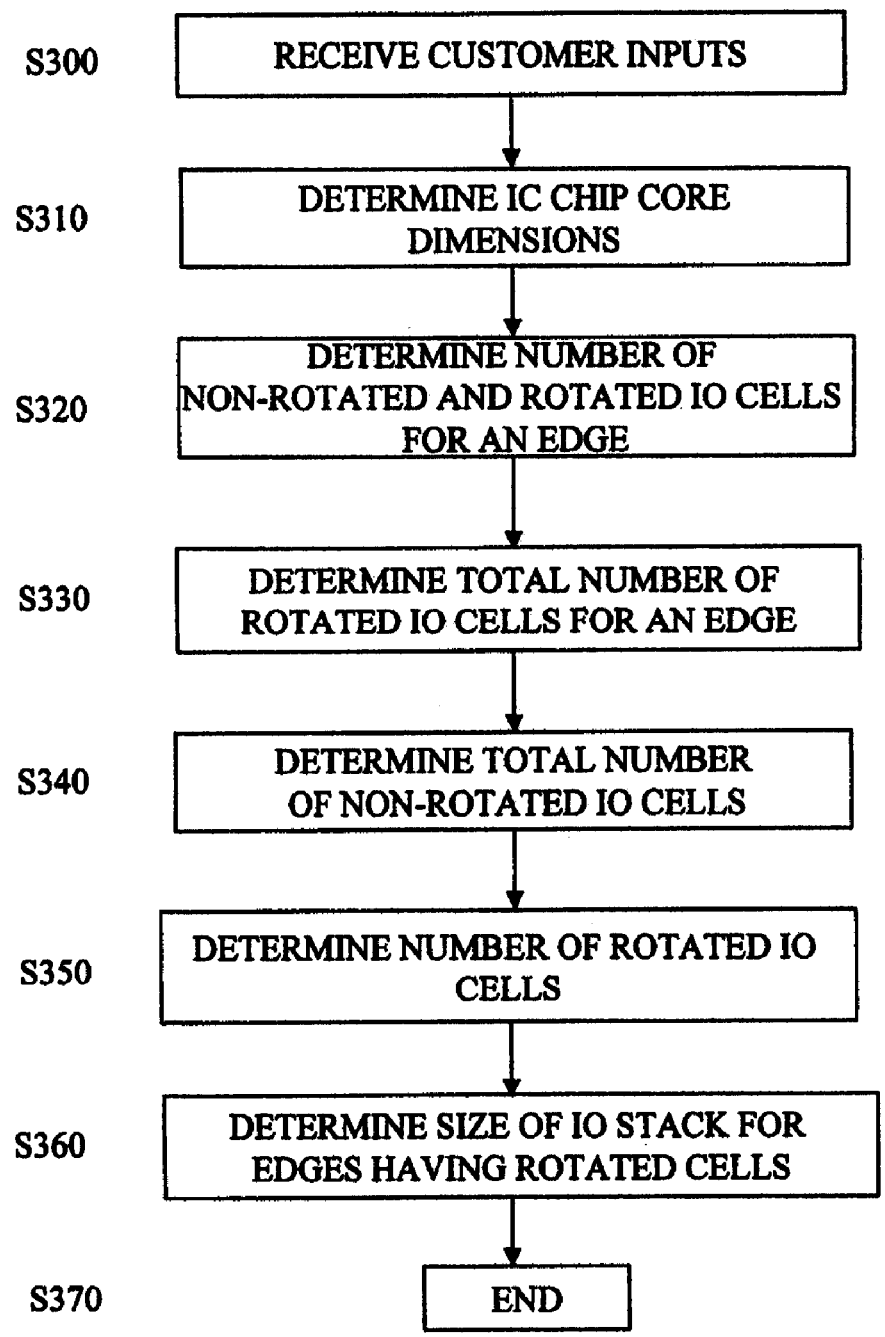
FIG. 6 shows steps of a third embodiment of the invention for configuring IO cells in an IO collar.

Referring to FIG. 6, steps of a third embodiment for configuring the arrangement of IC cells in an IO collar is shown, where the third embodiment receives required customer inputs (S300). Next, IC chip core dimensions are determined, which may include determining the IC core cell area aspect ratio (S310). For example, the IC core cell area aspect ratio may be found by finding the smallest core size and aspect ratio to meet CELLS>=CELLS_required. It should be noted that the aspect ratio may not equal one in order to optimize for the constraints described in "Required customer inputs" above. After the aspect ratio is found, the number of non-rotated and rotated IO cells in a single row per edge is found (S320). For example, the number of non-rotated SIOs in a single row that can fit on the vertical edges of the IC chip or vice versa is determined. Additionally, the number of rotated IOs in a single row that can fit on the remaining two edges of the chip is found.

The total number of required IO cells for the IC chip is then determined (S330). The total number of IO cells is found by taking the total SIO count plus number of unused IO cells needed to determine the total number of IO cells for the design. The number of non-rotated IO cells then determined (S340). More specifically, the number of SIOs and number of unused IO cells that can be placed non-rotated on the sides are found. Next, the number of rotated IO cells is found by determining the balance of SIOs and unused IO cells needed for the design (S350). For example, the balance of SIOs and unused IO cells may be found by taking the total SIO cells plus the number of unused IO cells needed to determine the total number of IO cells for the design and subtracting the total SIO count and number of unused IO cells placed on the non-rotated edges.

Next, the IO cell stack height is found for the two rotated edges (S360). The result of the number of rotated IOs in a single row that can fit on the first rotated edge of the IC chip times an integer (1, 2, 3, . . . ) is found; the number of rotated IOs in a single row that can fit on a second rotated edge of the IC chip times an integer (1, 2, 3, . . . ) is also found, where the integer is the number of IO cells in the stack, and thus cannot be a fractional number. The sum of the IO cells on the first and second rotated edges must be greater than or equal to the answer derived in step S350. The process then ends (S370).

Referring to FIG. 7, an example of an IO collar having rotated and non-rotated IO cells in accordance with the third embodiment is shown. Because the third embodiment allows for both rotated and non-rotated IO cells, 35 and 110, the third embodiment may potentially produce the greatest savings in IO collar size. As shown in FIG. 7, an IC chip 10 is surrounded by an IO collar made up of rotated IO cells 35 and non-rated IO cells. The IO cells along any particular edge are orientated the same, however, each edge may have IO cells of a different orientation as compared to other edges. More specifically, the edge 15 of the IC chip 10 has a single row 120 of non-rotated IO cells 110. Similarly, the edge 25 has a single row 115 of non-rotated IO cells 110. The edge 20 of the IC chip 10 has a single row 65 of rotated IO cells 35 and the edge 30 has a single row 40 of rotated IO cells 35.

Referring to FIG. 8, another example of an IO collar produced by the third embodiment is shown. In FIG. 8, an IC chip 10 has both rotated 35 and non-rotated 110 IO cells around it. It should be noted that each particular edge of the IC chip 10 could have only rotated IO cells 35 or non-rotated IO cells 110. Accordingly, the edge 15 of the IC chip 10 has a single row 120 of non-rotated JO cells 110. Similarly, the edge 25 has a single row 115 of non-rotated IO cells 110. The edge 20 of the IC chip 10 has three rows 65, 70, and 75 of rotated 10 cells 35. The edge 30 has four rows 40, 45, 50, and 55 of rotated IO cells 35. As such, the edge 20 and the edge 30 both contain rotated IO cells 35, each edge having a stack height greater than one, however each edge has a different number of rows of IO cells 35. Accordingly, the number of rotated IO cells 35 may be adjusted on each edge to optimize the size of the IO cell collar. Moreover, it is clearly seen in FIG. 8 that the stack height of the rotated IO cells 35 on both edge 20 and edge 30 is not greater than the length of an IO cell.

Referring to FIG. 9, the overall size of an IC chip and associated traditional IO collar 125 is shown compared to the overall size of an example of an IC chip and associated IO collar 130 made in accordance with one of the embodiments described above. As can be seen, the traditional chip design 125 is wider than the inventive chip design 130 example. The traditional chip design 125 has an IO collar whose thickness is defined by the length 135 of non-rotated IO cells. The inventive IC chip example has a thickness 140 of the IO cell stack height of the IO collar. Accordingly, each side of the traditional IC chip 125 is wider by a certain distance 145 as compared to the size of the inventive IC chip 130 example.

Accordingly, as described above, utilizing either only rotated IO cells or a combination of rotated and non-rotated IO cells allows a designer to produce an IO collar with a reduced number of unused IO cells. As such, the size of an IO collar arranged in accordance with the principles discussed herein will occupy less space, and the overall size of an IC chip and its associated IO collar can be reduced. Of course, those of skill in the art should understand that FIGS. 2, 3, 5 and 7-9 are exemplary, illustrative IO layout designs. Accordingly, the rotated and non rotated IO cells may include more or less rows, depending on the customer requirements and the like. So, for example, FIG. 8 may include, within the scope of the invention, more or less rows on any edge.

Thus, a method of laying out IO cells includes finding the smallest core size for number of cells required, and determining the number of rotated IO cells in a single row which can fit around the chip. The method also includes determining the total number of IO cells needed for the design by adding the total signal IO cell count to the number of unused IO cells, and calculating an IO stack height for the rotated IO cells. Additionally, the method includes comparing the IO collar area of a rotated IO stack to a non-rotated IO collar area to determine area savings, if any.

While the invention has been described in terms of exemplary embodiments, those skilled in the art will recognize that the invention can be practiced with modifications and in the spirit and scope of the appended claims.

What is claimed is:

1. A method of reducing the die size of an IC chip, comprising the steps of:
   determining a minimum number of IO cells required by the IC chip;
   arranging the minimum number of IO cells in rows of IO cells around edges of the IC chip where at least one of the rows of IO cells comprises rotated IO cells; and
   completing any incomplete row of IO cells of the rows of IO cells by adding unused IO cells to the incomplete row of IO cells.

2. The method of claim 1, further comprising orienting all the IO cells of each row of IO cells in a rotated position.

3. The method of claim 1, further comprising arranging the rows of IO cells so that each edge of the IC chip has the same number of rows of IO cells associated with the edge of the IC chip as each other edge of the IC chip.

4. The method of claim 1, further comprising receiving required customer inputs.

5. The method of claim 1, further comprising:
   determining a smallest size and an aspect ratio of a core of the IC chip;
   determining a number of rotated IO cells in a single row which can fit around the edges of the IC chip;
   determining a total number of signal IO cells and a total number of unused IO cells; adding the total number of signal IO cells to the total number of unused IO cells;
   determining an IO cell stack height where the total number of IO cells is less than or equal to a product of a total number of rotated IO cells in a single row which can fit around the edges of the IC chip times, an integer; and
   comparing the IO cell stack height to a length of an IO cell, wherein if the IO cell stack height is smaller than a length of an IO cell, the IO cell stack height is doubled and added to the circuit to determine a reduced die size, and if the IO cell stack height is equal or larger to the length of an IO cell the IO cells are not rotated.

6. The method of claim 1, further comprising:
   determining a smallest size and an aspect ratio of a core of an IC chip;

determining a number of rotated IO cells which can fit in a single row around a first and second horizontal edge of the IC chip;

determining a number of rotated IO cells which can fit in a single row around a first and second vertical edge of the IC chip;

determining a total number of IO cells required by the IC chip by determining a total number of signal IO cells and a total number of unused IO cells;

determining an actual number of rotated IO cells by:
multiplying the number of rotated IO cells of the first horizontal edge by a first integer,
multiplying the number of rotated IO cells of the second horizontal edge by a second integer,
multiplying the number of rotated IO cells of the vertical edge by a third integer,
multiplying the number of rotated IO cells of the second vertical edge by a fourth integer, where the first, second, third and fourth integers are selected such that the total number of rotated IO cells is greater than or equal to the total number of IO cells required by the IC chip;

comparing an x dimension and a y dimension of an IO collar formed by an actual number of rotated IO cells to an IO collar formed by non-rotated IO cells; and determining the x dimension of a reduced die size by adding 2 times the y dimension collar height to the x dimension of the core size, and determining the y dimension of a reduced die size by adding 2 times the x dimension collar height to the y dimension of the core of the IC chip.

7. The method of claim 1, further comprising:
determining a smallest size and an aspect ratio of a core of an IC chip;
determining a number of non-rotated signal IO cells in a single row which can fit along a first and second vertical edge of an IC chip;
determining a number of rotated signal IO cells in a single row which can fit along a first and second horizontal edge of the IC chip;
determining the total number of IO cells needed by the IC chip by adding the total number of signal IO cells to the number of unused IO cells;
determining the total number of non-rotated IO cells by determining the total number of non-rotated signal IO cells and non-rotated unused IO cells which can fit along the first and second vertical edges of the IC chip;
determining the balance of signal IO cells and unused IO cells by subtracting the total number of non-rotated IO cells from the total number of IO cells;
determining the rotated IO cell stack height for the first and second horizontal edges by:
multiplying the number of rotated IO cells of the first horizontal edge by a first integer, and
multiplying the number of rotated IO cells of the second horizontal edge by a second integer, where the first and second integers are selected such that the total number of rotated IO cells is greater than or equal to the balance of signal IO cells and unused IO cells.

8. A method of arranging IO cells in an IO collar, comprising the steps of:
determining an aspect ratio for IO cells;
determining a minimum number of functioning IO cells needed by an IC chip;
determining a total number of IO cells to fit along each edge of the IC chip;
determining an IO cell stack height for each edge of the IC chip based on the minimum number of functioning IO cells needed by the IC chip and the total number of IO cells to fit along an edge of the IC chip;
arranging IO cells in rows along each edge of the IC chip; and
completing any incomplete rows of IO cells by adding unused IO cells to the incomplete rows of IO cells.

9. The method of claim 8, further comprising orienting all the IO cells of each row of IO cells in a rotated position.

10. The method of claim 8, arranging the rows of IO cells so that each edge of the IC chip has a same number of rows of IO cells associated with the edge of the IC chip as each other edge of the IC chip.

11. The method of claim 8, further comprising receiving required customer inputs.

12. The method of claim 8, further comprising:
determining a smallest size and an aspect ratio of a core of an IC chip core;
determining a number of rotated IO cells in a single row which can fit around the edges of the IC chip;
determining a total number IO cells by determining a total number of signal IO cells and a total number of unused IO cells;
adding the total number of signal IO cells to the total number of unused IO cells;
determining an IO cell stack height where the total number of IO cells is less than or equal to the product of total number of rotated IO cells in a single row which can fit around the edges of the IC chip times an integer; and
comparing the IO cell stack height to a length of an IO cell, wherein if the IO cell stack height is smaller than the length of an IO cell, the IO cell stack height is doubled and added to the IC chip to determine a reduced die size, and wherein if the IO cell stack height is equal or larger to the length of an IO cell the IO cells are not rotated.

13. The method of claim 8, further comprising:
determining a smallest size and an aspect ratio of a core of an IC chip;
determining a number of rotated IO cells which can fit in a single row around a first and second horizontal edge of the IC chip;
determining a number of rotated IO cells which can fit in a single row around a first and second vertical edge of the IC chip;
determining a total number of IO cells required by the IC chip by determining a total number of signal IO cells and a total number of unused IO cells;
determine an actual number of rotated IO cells by:
multiplying the number of rotated IO cells of the first horizontal edge by a first integer,
multiplying the number of rotated IO cells of the second horizontal edge by a second integer,
multiplying the number of rotated IO cells of the first vertical edge by a third integer,
multiplying the number of rotated IO cells of the second vertical edge by a fourth integer, where the first, second, third and fourth integers are selected such that the total number of rotated IO cells is greater than or equal to the total number of IO cells required by the IC chip;
comparing an x dimension and a y dimension of an IO collar formed by the actual number of rotated IO cells to an IO collar formed by non-rotated IO cells; and determining the x dimension of a reduced die size by adding 2 times a y dimension collar height to an x dimension of the core size, and determining a y dimension of a reduced die size by adding 2 times an x dimension collar height to a y dimension.

14. The method of claim 8, further comprising:
determining a smallest size and an aspect ratio of a core of an IC chip;
determining a number of non-rotated signal IO cells in a single row which can fit along a first and second vertical edge of the IC chip;
determining a number of rotated signal IO cells in a single row which can fit along a first and second horizontal edge of the IC chip;
determining the total number of IO cells needed by the IC chip by adding the total number of signal IO cells to the number of unused IO cells;
determining the total number of non-rotated IO cells by determining the total number of non-rotated signal IO cells and non-rotated unused IO cells which can fit along the first and second vertical edges of the IC chip;
determining the balance of signal IO cells and unused IO cells by subtracting the total number of non-rotated IO cells from the total number of IO cells;
determining the rotated IO cell stack height for the first and second horizontal edges by:
multiplying the number of rotated IO cells of the first horizontal edge by a first integer, and
multiplying the number of rotated IO cells of the second horizontal edge by a second integer, where the first and second integers are selected such that the total number of rotated IO cells is greater than or equal to the balance of signal IO cells and unused IO cells.

15. The method of claim 8, wherein each edge of the IC chip comprises a different stack height.

16. An IO collar, comprising:
a first row of IO cells distributed along a first edge of an IC chip, wherein the first row of IO cells comprises non-rotated IO cells;
a second row of IO cells distributed along at least a second edge of the IC chip, wherein the second row comprises rotated IO cells;
a third row of IO cells distributed along a third edge of the IC chip; and
a fourth row of IO cells distributed along a fourth edge of the IC chip.

17. The IO collar of claim 16, wherein the third row of IO cells comprises non-rotated IO cells, and the fourth row of IO cells comprises rotated IO cells.

18. The IO collar of claim 17, wherein the second edge of the IC chip comprises an IO cell stack height greater than 1.

19. The IO collar of claim 18, wherein the fourth edge of the IC chip comprises an IO cell stack height greater than 1.

20. The IO collar of claim 19, wherein an IO cell stack height of either the second edge of the IC chip or the fourth edge of the IC chip is not greater than a length of an IO cell.

* * * * *